US012609286B2

(12) United States Patent
Woo et al.

(10) Patent No.: US 12,609,286 B2
(45) Date of Patent: Apr. 21, 2026

(54) PROTECTION TREATMENTS FOR SURFACES OF SEMICONDUCTOR FABRICATION EQUIPMENT

(71) Applicant: Applied Materials, Inc., Santa Clara, CA (US)

(72) Inventors: Katherine Woo, Santa Clara, CA (US); Jennifer Y. Sun, Fremont, CA (US); Jian Li, Fremont, CA (US); Wenhao Zhang, San Jose, CA (US); Mayur Govind Kulkarni, Bangalore (IN); Chidambara A. Ramalingam, Fremont, CA (US); Ryan Sheil, Santa Cruz, CA (US); Martin J. Seamons, San Jose, CA (US); Nitin Deepak, Thane (IN)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 17/981,394

(22) Filed: Nov. 5, 2022

(65) Prior Publication Data

US 2024/0153745 A1     May 9, 2024

(51) Int. Cl.
*C25D 11/18*          (2006.01)
*C23C 16/455*        (2006.01)
          (Continued)

(52) U.S. Cl.
CPC .. *H01J 37/32495* (2013.01); *C23C 16/45525* (2013.01); *C23C 28/046* (2013.01); *C25D 11/18* (2013.01); *H01J 37/32467* (2013.01)

(58) Field of Classification Search
CPC .......... H01J 37/32495; H01J 37/32467; C23C 16/45525; C23C 28/046; C23C 16/403;
          (Continued)

(56) References Cited

U.S. PATENT DOCUMENTS

2006/0159940 A1*   7/2006   Bhatnagar ........... C23C 16/4404
                                                204/192.15
2007/0207267 A1*   9/2007   Laube ................... C25D 11/04
                                                156/914
          (Continued)

FOREIGN PATENT DOCUMENTS

KR          20210025708 A       3/2021

OTHER PUBLICATIONS

Takahashi, H., et al., "Aluminum Anodizing", 2003, ASM Handbook, vol. 13A: Corrosion: Fundamentals, Testing, and Protection, p. 736-740 (Year: 2003).*

(Continued)

*Primary Examiner* — Gordon Baldwin
*Assistant Examiner* — Christina D Mcclure
(74) *Attorney, Agent, or Firm* — Kilpatrick Townsend & Stockton LLP

(57)          ABSTRACT

Semiconductor fabrication component preparation methods are described. In embodiments, the methods include forming a first layer on a surface of the semiconductor fabrication component. The first layer is characterized by a porosity of greater than or about 0.01 vol. %. The methods further include depositing a second layer on the first layer, where the second layer is characterized by a porosity of less than or about 20 vol. %. Treated semiconductor fabrication components are also described. In embodiments, the treated components include a first layer formed in the surface of the semiconductor fabrication component, where the first layer is characterized by a porosity of greater than or about 0.01 vol. %, and a second layer positioned on the first layer, where the second layer is characterized by a porosity of less than or about 20 vol. %.

15 Claims, 3 Drawing Sheets

308

(51) Int. Cl.
  *C23C 28/04*          (2006.01)
  *H01J 37/32*          (2006.01)

(58) Field of Classification Search
  CPC ... C23C 16/4404; C23C 28/042; C25D 11/18;
                                      C25D 11/04
  See application file for complete search history.

(56)                  References Cited

U.S. PATENT DOCUMENTS

| | | | |
|---|---|---|---|
| 2010/0119843 A1 | 5/2010 | Sun et al. | |
| 2011/0207283 A1* | 8/2011 | Haukka | H01L 21/02186 |
| | | | 257/E21.477 |
| 2012/0125488 A1 | 5/2012 | Sun et al. | |
| 2012/0261266 A1* | 10/2012 | Blawert | C25D 11/34 |
| | | | 205/333 |
| 2013/0174983 A1 | 7/2013 | Kikuchi et al. | |
| 2016/0240726 A1* | 8/2016 | He | C23C 16/4404 |
| 2017/0194272 A1 | 7/2017 | Mischitz et al. | |
| 2018/0096825 A1* | 4/2018 | Sun | C23C 14/0031 |
| 2018/0240649 A1* | 8/2018 | Smith | C23C 18/1254 |
| 2019/0304756 A1* | 10/2019 | Kalita | H01J 37/32495 |
| 2020/0291528 A1 | 9/2020 | He et al. | |
| 2021/0292893 A1* | 9/2021 | Mitrovic | H01J 37/32477 |

OTHER PUBLICATIONS

MSE Supplies, "List of Thermal Expansion Coefficients (CTE) for Natural and Engineered Materials", 2025, p. 1-20 (Year: 2025).*
International Search Report with accompanying Written Opinion, issued on Feb. 28, 2024, in corresponding International Application No. PCT/US2023/078554, 10 pages.
KR10-2025-7018240, "Office Action", Nov. 25, 2025, 20 pages.

* cited by examiner

200
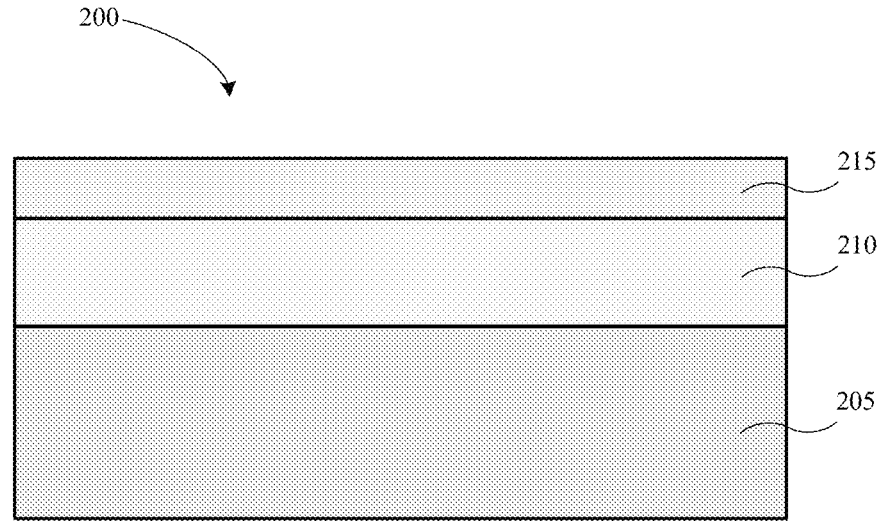
215
210
205
*FIG. 2*
300
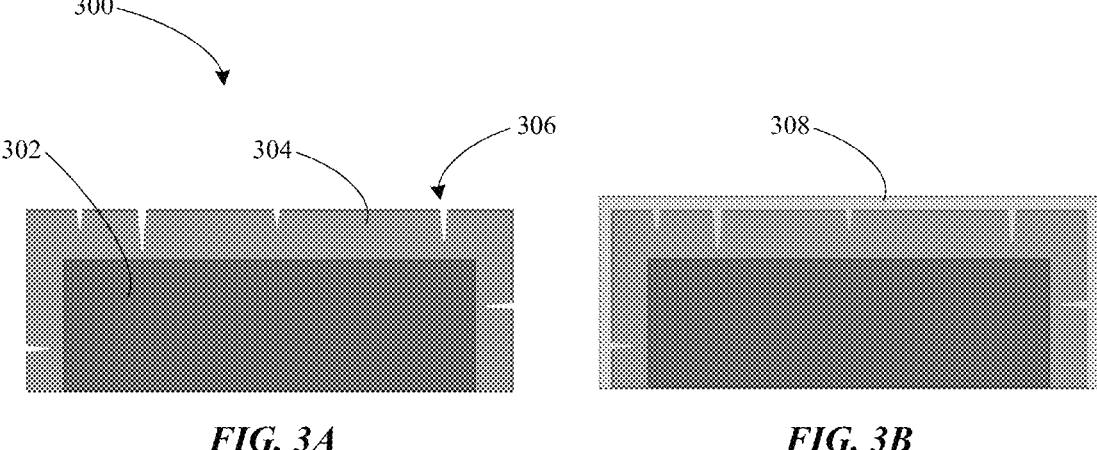
302    304    306    308
*FIG. 3A*    *FIG. 3B*

PROTECTION TREATMENTS FOR SURFACES OF SEMICONDUCTOR FABRICATION EQUIPMENT

FIELD

The present technology relates to protective coatings on components of semiconductor fabrication equipment that are subject to large and rapid changes in temperature. In embodiments, the protective layers include a first layer incorporated into a surface of the component and a second layer formed on the first layer.

BACKGROUND

Semiconductor fabrication processes typically include operations where a semiconductor substrate, such a semiconductor wafer, is raised to an elevated temperature and cooled to a lower temperature. In most fabrication processes, there is a thermal budget for these operations that set a highest heating temperature that cannot be exceeded without risking thermal damage to the developing structures on the substrate. Semiconductor fabrication equipment components in thermal contact with the substrate are chosen in part for their ability to raise and lower the substrate to precise temperatures during fabrication operations.

Conventional fabrication components that contact the substrate often include ceramic materials that are stable and inert during fabrication operations. These ceramics generate few contaminants for the substrate, and do not react with corrosive species, such as reactive halogen, oxide, and nitride species, generated during many semiconductor fabrication and cleaning operations. Unfortunately, these ceramic materials usually have low thermal conductivity that prevent them from rapidly changing the temperature of the adjacent substrate. The low thermal conductivity can keep the substrate at elevated temperatures for too long a period and result in an operation exceeding the thermal budget. The low thermal conductivity also lengthens the time to complete a thermal cycle, which can reduce the productivity of the fabrication system. These and other problems with conventional fabrication components are addressed by the present technology.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

FIG. 2 shows a simplified cross-sectional view of a fabrication component surface with a protective layer according to embodiments of the present technology.

FIG. 3A shows a simplified cross-sectional view of a fabrication component surface with a first layer of a protective layer according to embodiments of the present technology.

FIG. 3B shows a simplified cross-sectional view of a fabrication component surface with first and second layers of a protective layer according to embodiments of the present technology.

BRIEF SUMMARY

Figure 1:
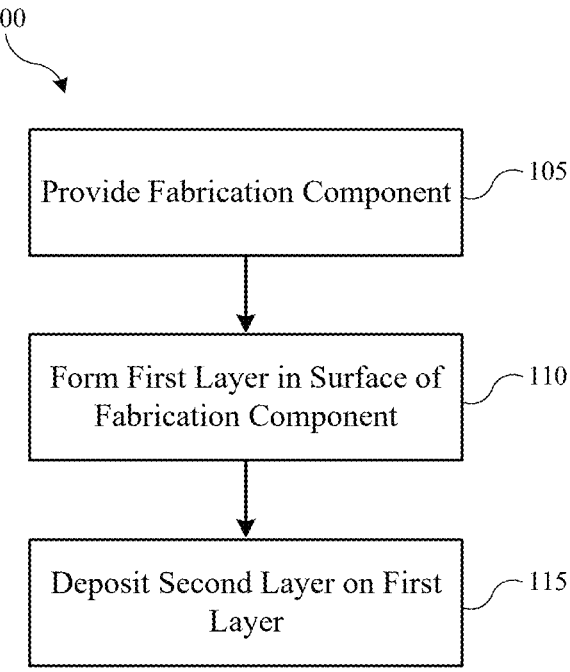
FIG. 1 shows a flowchart with selected operations of an exemplary method of treating a fabrication component according to embodiments of the present technology.

Embodiments of the present technology include semiconductor fabrication component preparation methods. In embodiments, the methods include forming a first layer on a surface of the semiconductor fabrication component. The first layer is characterized by a porosity of grater than or about 0.01 vol. %. The methods further include depositing a second layer on the first layer, where the second layer is characterized by a porosity of less than or about 20 vol. %.

In additional embodiments, the first layer may be characterized by a thickness of greater than or about 0.01 μm. In further embodiments, the first layer may be formed on the surface of the semiconductor fabrication component by an anodization technique selected from the group consisting of anodic aluminum oxidation, anodic titanium oxidation, barrier thick oxidation, and plasma electrolytic oxidation. In yet additional embodiments, the second layer may be characterized by a thickness of less than or about 10 μm. In still further embodiments, the second layer may include a metal, a metal boride, a metal carbide, a metal nitride, a metal oxide, a metal fluoride, a metal oxyfluoride, or $M1_xM2_yM3_zC_aB_bN_cO_dF_e$, wherein M1, M2, and M3 are, independently, a metal, and wherein x, y, z, a, b, c, d, and e, are greater than or equal to zero. In still additional embodiments, the second layer may include a metal selected from the group consisting of aluminum, yttrium, erbium, scandium, zirconium, and magnesium. In more embodiments, the semiconductor fabrication component may include aluminum. In yet more embodiments, the surface in the semiconductor fabrication component is a surface on a faceplate or heater element operable to be incorporated into a semiconductor fabrication chamber.

Additional embodiments of the present technology include methods of treating a semiconductor fabrication component. In embodiments, the methods include forming a first layer in a surface of the semiconductor fabrication component, wherein the first layer includes a grain structure characterized as amorphous, polycrystalline, crystalline, or mixed-phase. The methods further include depositing a second layer on the first layer, where the second layer is characterized by an amorphous, polycrystalline, crystalline, or mixed-phase grain structure. In some embodiments, the second layer is also characterized by a higher hardness than the first layer.

In further embodiments, the first layer is characterized by a thickness of greater than or about 0.01 μm. In additional embodiments, the first layer is formed on the surface of the semiconductor fabrication component by plasma electrolytic oxidation. In still further embodiments, the second layer is characterized by a thickness of less than or about 1 μm. In yet additional embodiments, the second layer is formed on the first layer by atomic layer deposition. In more embodiments, the second layer includes a metal oxide, a metal fluoride, or a metal oxyfluoride.

Further embodiments of the present technology include semiconductor fabrication components. In embodiments, the components include a surface of the semiconductor fabrication component. The components further include a first layer formed in the surface of the semiconductor fabrication component, where the first layer is characterized by a porosity of greater than or about 0.01 vol. %. The components also include a second layer positioned on the first layer, where the second layer is characterized by a porosity of less than or about 20 vol. %.

In more embodiments, the surface of the semiconductor fabrication component includes aluminum. In still more embodiments, the first layer is characterized by a thickness of greater than or about 50 µm, and further where the first layer is characterized by an amorphous grain structure. In additional embodiments, the second layer is characterized by a thickness of less than or about 10 µm, and further where the second layer is characterized by a crystalline grain structure. In further embodiments, the second layer comprises a metal oxide, a metal fluoride, a metal oxyfluoride, a metal nitride, a metal oxynitride, a metal carbine, a metal oxycarbide, a metal boride, or stoichiometric mixtures thereof. In still further embodiments, the semiconductor fabrication component may be a faceplate or a heater element operable to be incorporated into a semiconductor fabrication chamber.

The present technology provides several benefits over conventional semiconductor fabrication components that do not include a protection layer, or have single protection layer. When these conventional semiconductor fabrication components include unprotected metal surfaces in contact with a semiconductor substrate, such as a semiconductor wafer, they are prone to contaminate the substrate with metal from the surfaces. When the surfaces are protected by a single protection layer, such as a metal oxide layer deposited on the surfaces by atomic layer deposition (ALD), the difference in thermal expansion characteristics between the protection layer and component's surface create large thermal stresses that can lead to the cracking and dislodging of the protection layer. The present technology addresses this problem by forming a first layer in the surface of the semiconductor fabrication component that reduces the thermal stresses experienced by a second layer deposited on the first layer. The second layer may be characterized by a lower porosity, higher crystallinity, and higher hardness than the first layer that help prevent contaminants from migrating in either direction between the substrate processing region of a fabrication chamber and the metals in the surface of the protected semiconductor fabrication component. These and other embodiments of the present methods and components, along with many of their advantages and features, are described in more detail in conjunction with the below description and attached figures.

DETAILED DESCRIPTION

Many semiconductor fabrication methods require rapid temperature changes in a substrate such as a semiconductor wafer. These methods include a rapid increase in substrate temperature to facilitate the deposition or curing of a material on the substrate. The methods also include a rapid decrease in substrate temperature keep a fabrication operation within a thermal budget. To achieve these rapid temperature changes in the substrate, the components of the fabrication equipment are being made of materials with increased thermal conductivity. These materials include metals and metal alloys, among other materials with high thermal conductivity.

Making fabrication components out of metals presents a number of challenges, including the potential for metal contamination of the substrate. Component makers have addressed these challenges by depositing a protective layer on the surfaces of the components that come into direct or near contact with the substrate. For example, a thin protective layer of inert material may be deposited on the component surface to prevent migration of metal species from the surface to the substrate. The protective layer may also prevent reactive species found in the fabrication chamber from migrating to the metal component surface to cause component corrosion. In further embodiments, the protective layer may be made of dielectric materials that also prevent plasma arcing between plasma generating equipment in the fabrication chamber and coated metal surface of the component.

Unfortunately, many conventional protective layers consist of a single, thin coating layer with a large difference in the coefficient of thermal expansion from the underlying metal surface. When the component experiences rapid temperature changes, severe mechanical stresses are placed on the protective layer due to the different expansion rates. In a relatively short number of thermal cycles, the protective layer can start to crack, flake, and delaminate from the underlying metal surface. This increases the amount of contaminants that can migrate between the metal surface and the substrate, as well as create conduction pathways for plasma arcing. Significant chamber downtime is incurred while components with damaged protective layers are refurbished or replaced.

The present technology addresses these and other problems with conventional protective layers by forming a protective layer comprising at least one intermediate layer between surface of the component and an outer layer directly exposed to the substrate. In embodiments, the at least one intermediate layer may be formed in the component's surface by, for example, an anodization technique. The intermediate layer may be characterized by a higher porosity and lower degree of crystallinity than the outer layer. In embodiments, the one or more intermediate layers reduce the mechanical stresses placed on the outer layer during rapid temperature changes in the component. The more amorphous structure of the intermediate layer also shortens and closes pathways for contaminants to migrate between a component's metal surface and the substrate. In still further embodiments, the intermediate layer is complemented by an outer layer characterized by less porosity, a higher degree of crystallinity, and increased corrosion resistance to reactive species in chamber processing region. The combination of the intermediate layer and the outer layer provides a multilayer protective layer that can protect the metal-containing component for significantly more process cycles than a conventional, single-layer protective layer.

Figure 4:
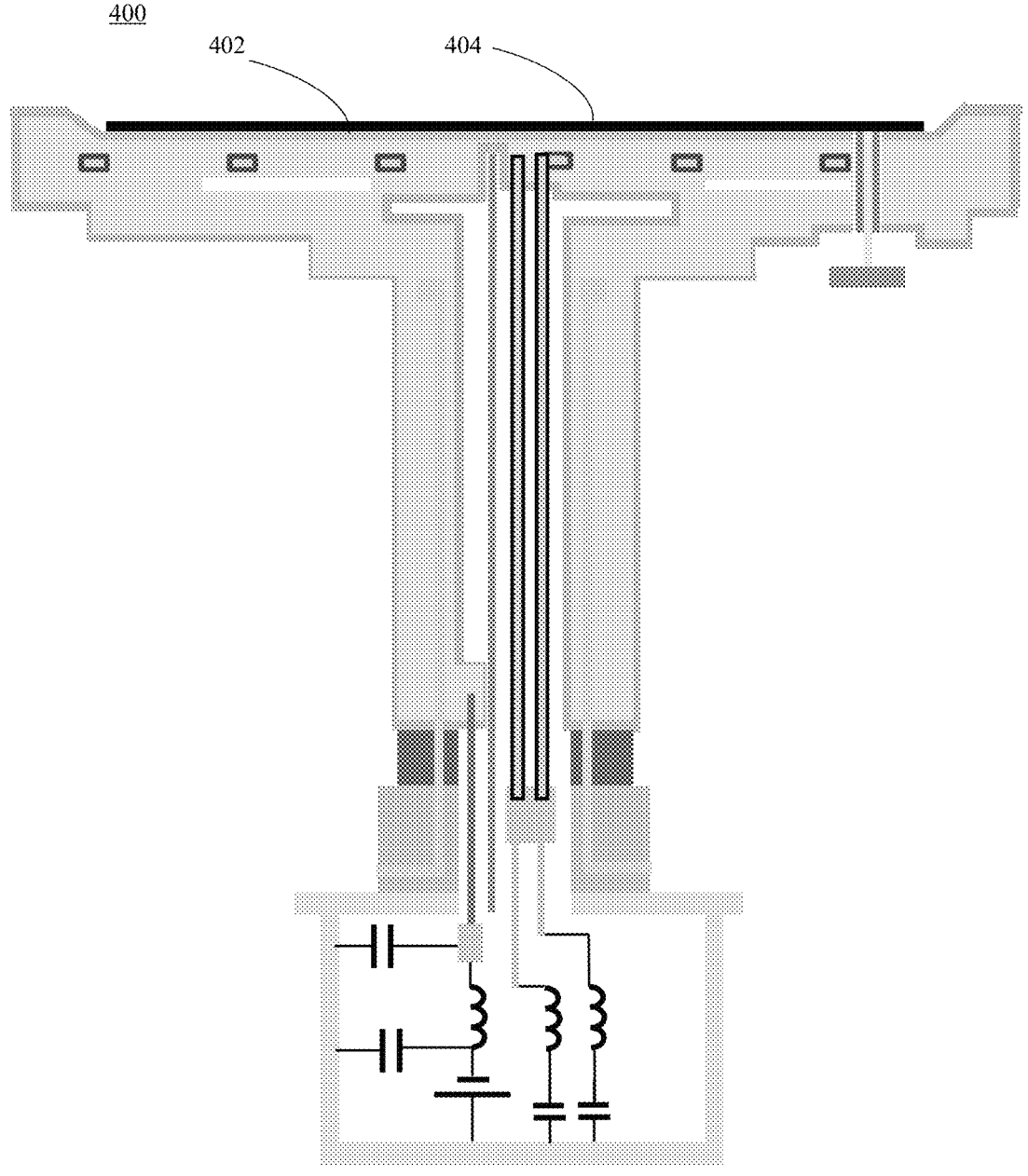
FIG. 4 shows a simplified cross-sectional view of a semiconductor fabrication pedestal that includes a surface with a protective layer according to embodiments of the present technology.

FIG. 1 shows a flowchart with selected operations in method 100 of preparing a fabrication component with a multilayer protective layer according to embodiments of the present technology. Method 100 may or may not include one or more operations prior to the initiation of the method, including molding, stamping, machining, polishing, cleaning, or any other operations that may be performed prior to the described operations. The method may include optional operations, which may or may not be specifically associated with some embodiments of methods according to the present technology. Method 100 describes operations to prepare a surface of a fabrication component, a portion of one of which is shown as component 200 in FIG. 2, another of which is shown as component 300 in FIGS. 3A-B, and another of which is shown as pedestal component 402 in FIG. 4. It should be appreciated that FIGS. 2-4 illustrate only partial schematic views with limited details. In further embodiments that are not illustrated, exemplary component and protective layer structures may contain additional layers, regions, and materials, having aspects as illustrated in the figures, as well as alternative structural and material aspects that may still benefit from any of the aspects of the present technology.

Method 100 includes providing a fabrication component at operation 105. In embodiments, fabrication components treated by the present methods may include faceplates, heating elements, wafer chucks, and pedestals, among other fabrication components. In further embodiments, the fabrication components include components that make contact or otherwise support and position a substrate (e.g., a semiconductor wafer) in a fabrication processing chamber. In still further embodiments, the fabrication components are operable for use in a corrosive processing environment where the components are frequently exposed to highly reactive chemical species such as halogen species (e.g., chlorine-containing species, fluorine-containing species), oxide species, and nitride species, among other reactive chemical species. In yet additional embodiments, the fabrication components are operable for exposure to frequent ion bombardment.

As shown in FIG. 2, layer 205 represents a portion of a fabrication component 200 in which the first layer 210 of the protective layer is formed. In embodiments, the fabrication component 200 includes layer 205 that has one or more surfaces of a material characterized by an increased thermal conductivity that permits more rapid temperature changes in a substrate in thermal contact with the component. In additional embodiments, the material may be characterized by a thermal conductivity of greater than or about 25 W/(m·K), greater than or about 50 W/(m·K), greater than or about 75 W/(m·K), greater than or about 100 W/(m·K), greater than or about 125 W/(m·K), greater than or about 150 W/(m·K), greater than or about 175 W/(m·K), greater than or about 200 W/(m·K), or more.

As noted above, many materials with increased thermal conductivity that can be incorporated into the fabrication components are also characterized by increased coefficients of thermal expansion. In embodiments, the materials used to form the one or more surfaces of the fabrication component may be characterized by a coefficient of linear thermal expansion of greater than or about $10 \times 10^{-6}/°$ C., greater than or about $11 \times 10^{-6}/°$ C., greater than or about $12 \times 10^{-6}/°$ C., greater than or about $13 \times 10^{-6}/°$ C., greater than or about $14 \times 10^{-6}/°$ C., greater than or about $\times 10^{-6}/°$ C., greater than or about $16 \times 10^{-6}/°$ C., greater than or about $17 \times 10^{-6}/°$ C., greater than or about $18 \times 10^{-6}/°$ C., greater than or about $19 \times 10^{-6}/°$ C., greater than or about $20 \times 10^{-6}/°$ C., or more. In further embodiments, the fabrication component includes one or more metal-containing surfaces. In additional embodiments, the metal-containing surface of layer 205 may include one or more metals selected from the group consisting of aluminum, iron, copper, nickel, and titanium, among other metals.

Method 100 may further include forming a first layer (e.g., first layer 210) in the surface of the layer of the fabrication component (e.g., layer 205) at operation 110. In embodiments, a portion of the surface of layer 205 of the fabrication component may be incorporated into the first layer during operation 110. In still further embodiments, the first layer 210 may be formed by an anodization technique that forms an anodized layer in the surface of layer 205. In yet more embodiments, the anodization technique may be selected from the group consisting of anodic aluminum oxidation, anodic titanium oxidation, barrier thick oxidation, and plasma electrolytic oxidation, among other anodization techniques. In additional embodiments, the first layer 210 may be characterized by a thickness of greater than or about 0.01 μm, a thickness of greater than or about 1 μm, a thickness of greater than or about 10 μm, a thickness of greater than or about 25 μm, greater than or about 30 μm, greater than or about 35 μm, greater than or about 40 μm, greater than or about 45 μm, greater than or about 50 μm, or more.

In embodiments, the first layer 210 may be characterized as more porous and more amorphous than the subsequently-deposited second layer 215. In additional embodiments, the increased porosity of the first layer 210 provides a mechanical stress buffer for the second layer 215 by having a coefficient of thermal expansion (CTE) that is intermediate between the component surface layer 205 and the second layer. In further embodiments, the more amorphous grain structure of the first layer 210 provides fewer channels that extend through the first layer from the surface layer 205 to the second layer 215. Fewer of these channels provides fewer opportunities for metal contaminants from surface layer 205 to migrate through the first layer 210, and fewer opportunities for reactive species from the processing chamber to migrate to the surface layer. In addition, the reduced number of long channels in the first layer 210 results in less plasma arcing between a plasma region in the processing chamber and electrically-conductive metal on the surface layer 205.

In additional embodiments, the first layer 210 may be characterized by a porosity of greater than or about 0.01 vol. % of the total volume of the layer. In more embodiments, the first layer 210 may characterized by a porosity of greater than or about 0.1 vol. %, greater than or about 0.5 vol. %, greater than or about 1 vol. %, greater than or about 2 vol. %, greater than or about 3 vol. %, greater than or about 4 vol. %, greater than or about 5 vol. %, or more. In further embodiments, the first layer 210 may be characterized as an amorphous or polycrystalline layer. In still further embodiments, the first layer 210 may be characterized by an average crystallinity of less than or about 50%, less than or about 40%, less than or about 30%, less than or about 20%, less than or about 10%, or less. In yet more embodiments, the first layer 210 may be characterized by a linear coefficient of thermal expansion that is less than the CTE of the material in surface layer 205. In embodiments, the first layer 210 may be characterized by a reduced CTE that is less than or about 90%, less than or about 80%, less than or about 70%, less than or about 60%, less than or about 50%, or less, of the CTE of the material in surface layer 205. In more embodiments, the first layer 210 may be characterized by a CTE that is greater than the CTE of second layer 215. In additional embodiments, the first layer 210 may be characterized by a CTE that is greater than or about 50%, greater than or about 60%, greater than or about 90%, greater than or about 80%, greater than or about 90%, or more, than the CTE of the second layer 215.

In more embodiments, the first layer 210 may include one or more metals selected from the group consisting of aluminum, iron, copper, nickel, titanium, and chromium, among other metals. In additional embodiments, the first layer 210 may include at least one oxide of one or more metals such as aluminum oxide ($Al_2O_3$) or titanium oxide ($TiO_2$), among other metal oxides.

In some embodiments, the forming of the first layer of the protective layer in operation 110 may include the anodization of a surface of a metal-containing component with plasma electrolytic oxidation (PEO). FIG. 3A shows a portion of a metal-containing component 302 with a first layer 304 incorporated by PEO into the exposed surfaces of the component. In embodiments, the PEO operation includes exposing one or more surfaces of the metal-containing component 302 to an electrolyte solution while applying a bias voltage to the component. In additional embodiments, the electrolyte solution may be an alkaline aqueous solution characterized by a pH of greater than 7, greater than or about 8, greater than or about 9, greater than or about 10, or more. In further embodiments, the electrolyte solution may include one or more dissolved alkali metal hydroxides and alkaline earth metal hydroxides, among other salts. In more embodiments, the voltage applied to the component during the PEO operation may be greater than or about 200 Volts, greater than or about 250 Volts, greater than or about 300 Volts, greater than or about 350 Volts, greater than or about 400 Volts, greater than or about 450 Volts, greater than or about 500 Volts, or more.

In embodiments, the PEO-formed first layer 304 may include as plurality of cracks, illustrated by crack 306, that forms during the anodization process. In further embodiments, the crack 306 may extend from a top surface of the first layer down to the surface of the metal-containing component 302. If left exposed, the crack 306 can provide a pathway for contaminants and plasma arcing. As discussed below, the plurality of cracks that include crack 306 are sealed by a second layer 308 to prevent the contaminant migration and plasma arcing.

Method 100 may still further includes depositing a second layer (e.g., second layer 215, 308) on the first layer (e.g., first layer 210) at operation 115. The second layer 215 may have a lower porosity than the first layer 210. The lower porosity of the second layer 215 can hinder the migration of contaminants between the surface of layer 205 and a substrate (not shown) in contact with the component 200. In embodiments, the second layer 215 may be characterized by a porosity of less than or about 20 vol. %, less than or about 15 vol. %, less than or about 10 vol. %, less than or about 5 vol. %, less than or about 1 vol. %, less than or about 0.1 vol. %, less than or about 0.05 vol. %, less than or about 0.001 vol. %, or less. As shown in FIG. 3B, the second layer 308 can also fill the crack 306 in the PEO-formed first layer 304 to prevent contaminant migration and plasma arcing during substrate processing operations.

In embodiments, the second layer may include one or more metals, metal borides, metal carbides, metal oxides, metal nitrides, metal oxynitrides, metal fluorides, metal oxyfluorides, metal fluoronitrides, and metal oxyfluoronitrides, among other materials. In further embodiments, the second layer may include one or more materials represented by the formula $MO_x$, $MN_y$, $MO_xN_y$, $MF_z$, $MO_xF_z$, $MO_xN_yF_z$, where M represents one or more metals selected from the group consisting of Al, Y, Er, Sc, Zr, Ni, Cr, Mg, Ti, Ta, and W, among other metals, and where x, y, and z, may include integers from 1 to 6. In more embodiments, M represents one or more rare earth elements. In yet more embodiments, the second layer may include one or more materials selected from the group consisting of $AlO_3$, $AlF_3$, $AlF_3$—$MgF_2$, among other materials. In still further embodiments, the second layer may include one or more materials represented by the formula $M1_xM2_yM3_zC_aB_bN_cO_dF_e$, wherein M1, M2, and M3 are, independently, a metal, and wherein x, y, z, a, b, c, d, and e, are, independently, greater than or equal to zero. In more embodiments, x, y, z, a, b, c, d, and e, are, independently, greater than zero. In yet additional embodiments, the metals M1, M2, and M3, may each independently be selected from the group consisting of Al, Y, Er, Sc, Zr, Ni, Cr, Mg, Ti, Ta, and W, among other metals.

In further embodiments, the second layer may have an increased corrosion resistance compared to the first layer formed in the component surface. In still further embodiments, the corrosion resistance may include a resistance of the second layer to a reaction with one or more reactive species that contact the second layer. In embodiments, these reactive species may include oxygen-containing species and halogen-containing species such a chlorine-containing species and fluorine-containing species, among other reactive species. In more embodiments, the corrosion resistance may include a slower etch rate of the second layer when exposed to the one or more reactive species. In still further embodiments, the second layer may be characterized by an increased corrosion resistance, as measured by a slower etch rate, compared to the first layer of greater than or about 10%, greater than or about 25%, greater than or about 50%, greater than or about 75%, greater than or about 100%, or more.

In additional embodiments, a second layer 215 that includes a metal oxide may be deposited using an ALD process comprising alternating exposure of the substrate to a first precursor and a second precursor. In additional embodiments, the first precursor may be a metal-containing precursor and the second precursor may be an oxygen-containing precursor. The ALD process may be advantageously performed if the substrate exhibits a non-planar topography as a result of the conformality of an ALD process. The ALD process is also appropriate for deposition on substantially planar surfaces.

In further embodiments the ALD deposition of a metal oxide second layer 215 may include depositing the metal oxide material on the first layer 210. In more embodiments, the metal oxide material may comprise one or more of aluminum oxide, lanthanum oxide, hafnium oxide, yttrium oxide, zirconium oxide, and cerium oxide, among other metal oxide materials. In additional embodiments, the metal oxide material may be deposited from an alternating exposure of the first layer 210 to a first metal-containing precursor and a second oxygen-containing precursor. In embodiments, the first metal-containing precursor may include one or more precursors such as (tert-butylimido)tris(diethylamido)tantalum (TBTDET), tetrakis(diethylamido)titanium (TDEAT), tetrakis(dimethylamino)titanium (TDMAT), tetrakis(ethylmethylamido)titanium (TEMAT), trimethylaluminum (TMA), pentakis(dimethylamino)tantalum(V) (PDMAT), tetrakis(dimethylamido)hafnium(Hf(NMe$_2$)$_4$) (TDMAH), tetrakis(dimethylamido)zirconium(Zr(NMe$_2$)$_4$) (TDMAZ), [Ce(thd)$_4$], [Ce(thd)$_3$phen], [Ce(Cp)$_3$], [Ce(CpMe)$_3$], [Ce(iprCp)$_3$], among other metal-containing precursors. In further embodiments, the second oxygen-containing precursor may include one or more of nitrous oxide (N$_2$O), oxygen (O$_2$), ozone (O$_3$), steam (H$_2$O), carbon monoxide (CO), carbon dioxide (CO$_2$), among other oxygen-containing precursors.

In additional embodiments, the component including the first layer 210 may be heated during the deposition of the second layer 215. In still additional embodiments, the component may be heated to greater than or about 100° C., greater than or about 150° C., greater than or about 200° C., greater than or about 250° C., greater than or about 300° C., greater than or about 350° C., greater than or about 400° C., or more.

In embodiments, the first metal-containing precursor for the second layer 215 may be flowed into the process chamber at a flow rate of greater than or about 200 sccm, greater than or about 400 sccm, greater than or about 600 sccm, greater than or about 800 sccm, greater than or about 1000 sccm, or more. In additional embodiments, the first metal-containing precursor is introduced into the process chamber with a carrier gas, such as an inert gas like nitrogen. In yet additional embodiments, the first precursor may be pulsed into the processing chamber. The word "pulse" used herein is intended to refer to a quantity of a particular compound that is intermittently or non-continuously introduced into a reaction zone of a processing chamber. In embodiments, a monolayer of the first precursor may be formed on the substrate as a result of the pulsing thereof. In more embodiments, the first metal-containing precursor may be pulsed into the processing chamber for a time of greater than or about 100 milliseconds (ms), greater than or about 200 ms, greater than or about 300 ms, greater than or about 400 ms, greater than or about 500 ms, greater than or about 600 ms, greater than or about 700 ms, greater than or about 800 ms, greater than or about 900 ms, greater than or about 1000 ms, or more. In still more embodiments, the first metal-containing precursor may be heated to a temperature of greater than or about 25° C., greater than or about 50° C., greater than or about 75° C., greater than or about 100° C., greater than or about 125° C., or more.

In more embodiments, a purge operation may be performed before flowing the second oxygen-containing precursor into the processing chamber. In further embodiments, the purge operation may include flowing a purge gas into the processing chamber after reducing or stopping the supply of the first metal-containing precursor to the substrate. In further embodiments, the purge process may include pulsing a purge gas, such as argon or nitrogen gas, into the processing chamber for a time greater than or about 0.5 seconds, greater than or about 1 second, greater than or about 2.5 seconds, greater than or about 5 seconds, greater than or about 7.5 seconds, greater than or about 10 seconds, or more.

In still additional embodiments, the second oxygen-containing precursor may be pulsed into the processing chamber for a time of greater than or about 0.15 s, greater than or about 0.5 s, greater than or about 1 s, greater than or about 2.5 s, greater than or about 5 s, greater than or about 10 s, greater than or about 15 s, greater than or about 20 s, greater than or about 25 s, greater than or about 30 s, or more. In additional embodiments, the second oxygen-containing precursor may be flowed into the process chamber at a flow rate of greater than or about 50 sccm, greater than or about 100 sccm, greater than or about 200 sccm, greater than or about 400 sccm, greater than or about 600 sccm, greater than or about 800 sccm, greater than or about 1000 sccm, or more. In yet more embodiments, the second oxygen-containing precursor may be heated to greater than or about 20° C., greater than or about 25° C., greater than or about 30° C., or more. In embodiments, a plasma is generated in the processing chamber while the second oxygen-containing precursor is flowed therein. In further embodiments, the plasma may be generated by applying an RF power to a plasma generator, such as the ICP coil assembly or CCP assembly. For example, an RF generator may apply an RF power between about 100 W to about 300 W, such as about 200 W, and at a frequency between of 13.56 MHz to the ICP coil assembly or the CCP assembly.

In yet additional embodiments, another purge process may be performed following the pulsing of the second oxygen-containing precursor. The second purge process may be performed to remove any residual second precursor in the processing chamber. Similar to the purge process for the first metal-containing precursor, the additional purge process may include pulsing a purge gas, such as argon, into the processing chamber for a time greater than or about 0.5 seconds, greater than or about 1 second, greater than or about 2.5 seconds, greater than or about 5 seconds, greater than or about 7.5 seconds, greater than or about 10 seconds, or more.

In embodiments, the pulsing of the first metal-containing precursor and the second oxygen-containing precursor into the processing chamber may be a cycle, and the cycle may include the first and second purge processes after flowing the first precursor into the processing chamber and after flowing the second precursor into the processing chamber. In additional embodiments, the cycle is repeated to grow the metal oxide layer. The number of cycles is based on the final thickness of the final metal oxide layer. In embodiments, the growth rate of the metal oxide layer may be greater than or about 0.25 Å/cycle, greater than or about 0.5 Å/cycle, greater than or about 0.75 Å/cycle, greater than or about 1 Å/cycle, greater than or about 1.5 Å/cycle, greater than or about 2 Å/cycle, or more. For example, the growth rate of the metal oxide layer may be about 1 A per cycle, depending on the precursor materials utilized. A final thickness of the metal oxide layer may be less than or about 1 μm, less than or about 0.9 μm, less than or about 0.8 μm, less than or about 0.7 μm, less than or about 0.6 μm, less than or about 0.5 μm, less than or about 0.4 μm, less than or about 0.3 μm, less than or about 0.2 μm, less than or about 0.1 μm, or less.

In additional embodiments, a second layer 215 that includes a metal nitride which may be deposited using an ALD process comprising alternating exposure of the substrate to a first precursor and a second precursor. In additional embodiments, the first precursor may be a metal-containing precursor and the second precursor may be a nitrogen-containing precursor. The ALD process may be advantageously performed if the substrate exhibits a non-planar topography as a result of the conformality of an ALD process. The ALD process is also appropriate for deposition on substantially planar surfaces.

In still additional embodiments, the first metal-containing precursor may include any suitable metal-containing precursor for forming the metal nitride film, such as aluminum, titanium, tantalum, and the like. In embodiments, the first metal-containing precursor is selected from the group comprising (tert-butylimido)tris(diethylamido)tantalum (TBT-DET), tetrakis(diethylamido)titanium (TDEAT), tetrakis(dimethylamino)titanium (TDMAT), tetrakis(ethylmethylamido)titanium (TEMAT), trimethylaluminum (TMA), pentakis(dimethylamino)tantalum(V) (PDMAT), and combinations thereof. In some embodiments, the metal-containing precursor is free of fluorine. In more embodiments, the second nitrogen-containing precursor may include one or more of ammonia ($NH_3$), hydrazine ($N_2H_4$), methylhydrazine ($CH_3(NH)NH_2$), dimethylhydrazine ($C_2H_8N_2$), t-butylhydrazine ($C_4H_{12}N_2$), pheylhydrazine ($C_6H_8N_2$), azoisobutane ($C_4H_8N_2$), ethylazide ($CH_3N_3$), among other nitrogen-containing precursors.

In additional embodiments, a second layer 215 that includes a metal oxyfluoride or metal fluoronitride which may be deposited using an ALD process comprising alternating exposure of the substrate to a first precursor, a second precursor, and a third precursor. In additional embodiments, the first precursor may be a metal-containing precursor, the second precursor may be an oxygen-containing and/or nitrogen-containing precursor, and the third precursor may be a fluorine-containing precursor. In yet additional embodiments, the metal oxyfluoride or metal fluoronitride layer may be deposited by ALD using alternating exposures of a first metal-containing precursor and a second oxyfluoride-containing and/or fluoronitride-containing precursor. In embodiments, the ALD process may be advantageously performed if the substrate exhibits a non-planar topography as a result of the conformality of an ALD process. The ALD process is also appropriate for deposition on substantially planar surfaces.

FIG. 4 shows a heated pedestal 400 that includes a substrate chuck 402 that includes a multilayer protective layer according to embodiments of the present technology. A substrate 404 is placed in direct contact with the substrate chuck 402 during one or more substrate processing operations. These operations may include raising and lowering the temperature of the substrate during one or more of the processing operations. The substrate chuck 402 includes one or more metals, such as aluminum, with a higher thermal conductivity than a conventional ceramic material to facilitate a more rapid temperature change in the substrate 404 during a processing operation. The multilayer protective layer (not shown) positioned between the substrate 404 and the metal surfaces of the substrate chuck 402 prevents contaminants in the chuck, including the metals used to make the chuck, from migrating to the substrate. The protective layer also reduces plasma arcing between the substrate chuck 402 and a plasma during operations that generate a plasma.

I should be appreciated that the substrate chuck 402 that includes a multilayer protective coating according to embodiments of the present technology is but one of many types of substrate processing components that can include the protective coating. Additional substrate processing components include faceplates and heating elements, among other substrate processing components. The multilayer protective coating provides several advantages to the components, including an increased corrosion resistance, and increased hardness, a reduced amount of metal contamination in the substrates contacting the component, and a reduced rate of plasma arcing during plasma operations, among other advantages.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the pixel structure" includes reference to one or more pixel structures and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method comprising:
   forming a first layer on a surface of a semiconductor fabrication component by plasma electrolytic oxidation, wherein the first layer is characterized by a porosity of greater than or about 0.01 vol. %, wherein the first layer is characterized by an amorphous grain structure and an average crystallinity of less than or about 50%, and wherein the first layer consists of one or more of aluminum, iron, copper, nickel, titanium, chromium, and oxygen; and
   depositing a second layer on the first layer, wherein the second layer is characterized by a porosity of less than or about 20 vol. %.

2. The method of claim 1, wherein the first layer is characterized by a thickness of greater than or about 0.01 μm.

3. The method of claim 1, wherein the second layer is characterized by a thickness of less than or about 10 μm.

4. The method of claim 3, wherein the second layer comprises a metal, a metal boride, a metal carbide, a metal nitride, a metal oxide, a metal fluoride, a metal oxyfluoride, or $M1_xM2_yM3_zC_aB_bN_cO_dF_e$, wherein M1, M2, and M3 are, independently, a metal, and wherein x, y, z, a, b, c, d, and e, are greater than or equal to zero.

5. The method of claim 4, wherein the second layer comprises a metal selected from the group consisting of aluminum, yttrium, ebrium, scandium, zirconium, and magnesium.

6. The method of claim 1, wherein the surface in the semiconductor fabrication component comprises aluminum.

7. The method of claim 1, wherein the surface in the semiconductor fabrication component is a surface on a faceplate or heater element operable to be incorporated into a semiconductor fabrication chamber.

8. The method of claim 1, wherein the second layer is characterized by an amorphous, polycrystalline, crystalline, or mixed-phase grain structure.

9. The method of claim 1, wherein the second layer is formed on the first layer by atomic layer deposition.

10. The method of claim 1, wherein the second layer comprises a metal oxide, a metal fluoride, or a metal oxyfluoride.

11. The method of claim 1, wherein the second layer is characterized by a crystalline grain structure.

12. The method of claim 1, wherein the second layer comprises a metal oxide, a metal fluoride, a metal oxyfluoride, a metal nitride, a metal oxynitride, a metal carbine, a metal oxycarbide, a metal boride, or stoichiometric mixtures thereof.

13. The method of claim 1, wherein:
   the first layer is characterized by a coefficient of thermal expansion (CTE) less than or about 90% a CTE of a material defining the surface of the semiconductor fabrication component; and
   the CTE of the first layer is greater than a CTE of the second layer.

14. The method of claim 1, wherein the first layer is characterized by an average crystallinity of less than or about 10%.

15. The method of claim 1, wherein the first layer is free of a crystalline grain structure or a mixed-phase grain structure.

\*    \*    \*    \*    \*